(12) United States Patent
Kumagai et al.

(10) Patent No.: US 6,746,776 B1
(45) Date of Patent: Jun. 8, 2004

(54) LAMINATED STRUCTURE, AND MANUFACTURING METHOD THEREOF

(75) Inventors: Sho Kumagai, Kodaira (JP); Masato Yoshikawa, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/868,190

(22) PCT Filed: Dec. 2, 1999

(86) PCT No.: PCT/JP99/06778

§ 371 (c)(1),
(2), (4) Date: Jun. 15, 2001

(87) PCT Pub. No.: WO00/37708

PCT Pub. Date: Jun. 29, 2000

(30) Foreign Application Priority Data

Dec. 22, 1998 (JP) .......................................... 10/365235
Nov. 29, 1999 (JP) .......................................... 11/337616

(51) Int. Cl.$^7$ ............................................... B32B 15/04
(52) U.S. Cl. .................. 428/450; 428/469; 428/627; 428/687; 428/698; 428/908.8; 427/127; 427/249.15; 427/585; 427/589
(58) Field of Search ................................ 428/450, 469, 428/627, 687, 698, 900, 908.8; 427/127, 249.15, 585, 589

(56) References Cited

U.S. PATENT DOCUMENTS

| | | | |
|---|---|---|---|
| 4,735,853 A | * | 4/1988 | Okudaira et al. ............ 428/336 |
| 5,562,965 A | * | 10/1996 | Gui et al. ..................... 428/220 |
| 5,733,370 A | * | 3/1998 | Chen et al. ................... 117/105 |
| 6,217,969 B1 | * | 4/2001 | Takahashi et al. ......... 204/192.15 |

FOREIGN PATENT DOCUMENTS

| | | | |
|---|---|---|---|
| EP | 446 988 A1 | 9/1991 | |
| JP | A 4-17661 | 1/1992 | |
| JP | A 9-310170 | 12/1997 | |
| JP | A 10-44160 | 2/1998 | |
| JP | A 10-67565 | 3/1998 | |
| JP | 11061394 | * 3/1999 | ........... C23C/14/34 |
| JP | A 2000-169232 | 6/2000 | |
| JP | A 2000-169233 | 6/2000 | |
| JP | A 2000-169246 | 6/2000 | |
| JP | A 2000-173968 | 6/2000 | |
| WO | WO 91/07519 | 5/1991 | |

* cited by examiner

*Primary Examiner*—Deborah Jones
*Assistant Examiner*—Andrew Piziali
(74) *Attorney, Agent, or Firm*—Oliff & Berridge, PLC

(57) ABSTRACT

There is provided a laminated structure having a silicon carbide coating layer formed by sputtering on an alloy substrate, and the silicon carbide has a light transmittance of 70% or greater. It is preferable that the alloy substrate is a magnetic alloy or a phase-changing alloy, the impurity ratio on the surface of the silicon carbide coating layer is $1.0 \times 10^{12}$ atoms/cm$^2$ or less and the thickness of the silicon carbide coating layer is 10 to 100 nm. Since the laminated structure has a silicon carbide coating layer which is excellent in oxidation resistance, chlorine resistance, humidity resistance, and which has high refractive index, high light transmittance and the like, it is suitable for an optical disk recording medium such as a CD-RW, a DVD-RAM or the like.

13 Claims, No Drawings

LAMINATED STRUCTURE, AND MANUFACTURING METHOD THEREOF

TECHNICAL FIELD

The present invention relates to a laminated structure and a manufacturing method thereof, and in particular, to a laminated structure having a coating layer which is particularly suitable for an optical disk recording medium, and a manufacturing method thereof.

BACKGROUND ART

There are two processes for recording in a rewritable optical disk such as a CD-RAM or a DVD-RAM. One process is a photomagnetic recording and another process is a phase-changing recording. An alloy such as a TeFeCo alloy is used for a recording layer of the optical disk used for the photomagnetic recording. An alloy such as a GaSbTb alloy is used for a recording layer of the optical disk used for the phase-changing recording. Since the aforementioned alloys are easily oxidized, in general, a dielectric layer such as a silicon nitride layer is applied on the alloys by sputtering. The coating layer functions as a protective layer and prevents oxidization of the alloys. Further, characteristics such as chlorine resistance, moisture resistance, high refractive index, high light transmittance are required for the protective layer.

In general, a silicon nitride layer is formed by sputtering a silicon target material while nitride is introduced thereto. As an arc discharge easily occurs and it is difficult to apply high electric power to the silicon nitride layer, it is difficult to manufacture the silicon nitride layer. Further, there arise problems in that the silicon nitride layer has low light transmittance, refractive index and thermal conductivity.

In order to form the protective layer on the rewritable optical disk, in general, sputtering is used. One of the reasons why sputtering is used is that in order to reduce manufacturing costs, rather than a chemical method such as CVD method, a physical method such as sputtering, ion plating, vacuum disposition or the like is advantageous. Among the physical methods, in sputtering especially, a speed of forming the protective layer is high and the close-contact between the protective layer and a substrate is excellent. If a DC electric supply which enables high speed formation of the protective layer is used, a target material used in the sputtering must have a conductivity of $10^0$ Ω·cm or less, preferably $10^{-2}$ Ω·cm or less in terms of a volume resistivity.

The present invention has been devised to solve the above-described problems and to provide a laminated structure which is suitable for an optical disk recording medium such as a CD-RW, a DVD-RAM or the like by providing a silicon carbide coating layer which is excellent in chlorine resistance, humidity resistance, and has high refractive index and high light transmittance, and a manufacturing method thereof which enables easy and reliable manufacturing of the laminated structure.

DISCLOSURE OF INVENTION

As a result of their diligent study in order to attain the aforementioned object, the present inventors noted the following points. That is, as a result of research to obtain alternatives to the target material necessary for preparing a derivative such as a silicon nitride, as a target material used in sputtering, it was found that most metals generally have large gravity and thus, it is difficult to handle them. Further, in order to obtain a light reflectance necessary for the protective layer in order to form a pure metallic thin layer which has the same property as the target material at the time of sputtering, the thickness of the protective layer must be controlled. Therefore, manufacturing of such a target material is difficult. Alternatively, most ceramics materials are usually insulating materials. Thus, the ceramics materials are not suitable for the target material. A sintered silicon carbide is effective as the target material which can control the optical characteristics of the protective layer which can be formed thin depending on sputtering conditions.

As the target material which can control the optical characteristics of the protective layer depending on the sputtering conditions, a sintered silicon carbide to be described below is effective. The sintered silicon carbide has high density, high purity and a volume resistivity of $10^0$ Ω·cm or less, and is obtained by carrying out a step of charging a nitrogen-containing compound at the time of preparing a mixture of silicon carbide powder and non-metallic sintered aid or a step of charging the nitrogen-containing compound at the time of mixing carbide material and silicon material which are materials for silicon carbide powder during manufacturing thereof, in a manufacturing process of a sintered silicon carbide disclosed in Japanese Patent Application Laid-Open (JP-A) No. 10-67565 which has already been proposed by the present inventors. Further, a sintered silicon carbide is more effective, which has an impurity ratio of $1.0 \times 10^{11}$ atoms/cm$^2$ or less on or in a vicinity of its surface due to a washing method disclosed in Japanese Patent Application Nos. 10-348569 and 10-348701 being carried out, and which has high density, high purity and a volume resistivity of $10^0$ Ω·cm or less.

The present invention is based on the above-described findings of the present inventors, and includes the following aspects.

<1> A laminated structure having a silicon carbide coating layer formed on an alloy substrate by sputtering, wherein the silicon carbide coating layer has a light transmittance of 70% or greater.

<2> The laminated structure according to <1>, wherein the alloy substrate is formed of a magnetic alloy or a phase-changing alloy.

<3> The laminated structure according to <1> or <2>, wherein an impurity ratio on the surface of the silicon carbide coating layer is $1.0 \times 10^{12}$ atoms/cm$^2$ or less.

<4> The laminated structure according any of <1> through <3>, wherein the thickness of the silicon carbide coating layer is 10 to 100 nm.

<5> A manufacturing method of a laminated structure having a silicon carbide coating layer formed by sputtering with a target material, wherein the silicon carbide coating layer is formed by controlling electric power inputted to a sputtering device, flow rate of oxygen gas or nitrogen gas introduced and sputtering time.

<6> The manufacturing method of a laminated structure according to <5>, wherein the target material is a sintered silicon carbide, and the sintered silicon carbide has an impurity ratio of $1.0 \times 10^{11}$ atoms/cm$^2$ or less on and in a vicinity of the surface thereof, a density of 2.9 g/cm$^3$ or greater, and a volume resistivity of $10^0$ Ω·cm or less.

BEST MODE FOR CARRYING OUT THE INVENTION

Hereinafter, a laminated structure and a manufacturing method thereof relating to the present invention will be explained in detail.

The laminated structure of the present invention has a silicon carbide coating layer on an alloy substrate. The silicon carbide coating layer has a light transmittance of 70% or greater.

The alloy substrate is formed of a magnetic alloy or a phase-changing alloy.

Examples of the magnetic alloy include a TeFeCo alloy, a GdTbFe alloy and a GdDyFeCo alloy.

Examples of the phase-changing alloy include a GaTb-FeCo alloy, a GaSbTb alloy, an AlInSbTe alloy, a GeTeSb alloy and the like.

The silicon carbide coating layer is appropriately formed by sputtering with a sintered silicon carbide used as the target material.

The light transmittance of the silicon carbide coating layer is 70% or greater and preferably 80% or greater and more preferably 90% or greater.

The light transmittance is computed as follows. First, a light transmittance spectrum is measured for a complex obtained by forming a silicon carbide coating layer having a thickness of 100 nm on a glass substrate having a thickness of 1 mm, using a spectral photometer (U-4000 manufacture by Hitachi, Ltd.) while the wavelength of incident light is changed from 250 nm to 1,000 nm. Next, a light reflectance spectrum is measured for a complex obtained by forming a silicon carbide coating layer having a thickness of 100 nm on a glass substrate having a thickness of 1 mm whose back surface is treated such that light is not reflected thereby, using a spectral photometer (U-4000 manufactured by Hitachi, Ltd.) while the wavelength of incident light is changed from 250 nm to 1,000 nm. On the basis of the resultant light transmittance spectrum and the light reflectance spectrum, a spectrum of the real number portion of the refractive index and a spectrum of the imaginary number portion of the refractive index are computed using a refractive index analyzing device (Iris 200 manufactured by n & k Technology). By inserting a spectrum of the real number portion of the refractive index and a spectrum of the imaginary number portion of the refractive index at a wavelength of incident light of 633 nm of the computed spectrum of the real number portion of the refractive index and the computed spectrum of the imaginary number portion of the refractive index into the following formula, the light transmittance (%) of the silicon carbide coating layer having a desired thickness can be obtained. The aforementioned light transmittance refers to this light transmittance (%). The following formula takes a multiple reflection interference effect within planar layers which are parallel to each other into consideration.

$$\text{Light Transmittance } T(\%) = \frac{e^{-\alpha d}\{(1-r)^2 + 4r\sin^2\phi\}}{\{(1-re^{-\alpha d})^2 + 4re^{-\alpha d}\sin^2(\phi+\beta)\}} \times 100$$

$$\alpha = 4\pi\kappa/\lambda$$

$$\beta = 2\pi nd/\lambda$$

$$r = \{(n-1)^2 + \kappa^2\}/\{(n+1)^2 + \kappa^2\}$$

$$\tan\phi = 2\kappa/(n^2 + \kappa^2 + 1)$$

$$\kappa = k/n$$

In the above formula, $\lambda$ represents the wavelength of incident light (633 nm). n represents the real number portion of the refractive index. k represents the imaginary number portion of the refractive index. d represents the thickness of the silicon carbide coating layer.

If the light transmittance is 70% or greater, the silicon carbide coating layer functions as a protective layer of a rewritable optical disk such as a CD-RW, a DVD-RAM or the like. The light transmittance of less than 70% is not preferable because less light is reflected from the recording layer. Further, it is difficult to read the information of the recording layer. Moreover, the probability of generation of errors increases.

The impurity ratio on the surface of the silicon carbide coating layer is preferably $1.0 \times 10^{12}$ atoms/cm$^2$ or less.

If the impurity ratio exceeds $1.0 \times 10^{12}$ atoms/cm$^2$, defects are easily generated at the time of forming a disk on a pit, which causes an increase in the probability of generation of errors.

The thickness of the silicon carbide coating layer is preferably 10 to 100 nm in view of production efficiency.

If the thickness of the silicon carbide coating layer is less than 10 nm, protective characteristics for preventing oxidation, chlorination and humidification of an alloy substrate may deteriorate. If the thickness of the silicon carbide coating layer exceeds 100 nm, the light transmittance is reduced, the information of the recording layer is difficult to be read, and this may cause an increase in the probability of generation of errors.

The laminated structure of the present invention may be appropriately manufactured by a manufacturing method of a laminated structure of the present invention to be described below.

A characteristic of the manufacturing method of a laminated structure of the present invention is that at the time of forming a silicon carbide coating layer of the laminated structure of the present invention on an alloy substrate by sputtering with a target material used, electric power inputted to a sputtering device, flow rate of oxygen gas or nitrogen gas introduced and sputtering time are controlled.

A method of sputtering depends on a conductivity of a target material to be used. When the conductivity of the target material is low, high frequency sputtering, high frequency magnetron sputtering or the like is used. When the conductivity of the target material is high, DC sputtering, DC magnetron sputtering or the like is used.

Of the aforementioned methods, if a sintered silicon carbide is used as the target material, DC sputtering or DC magnetron sputtering is preferable because the target material is conductive.

The volume resistivity of the target material in DC sputtering which enables rapid formation of the coating layer is preferably $10^0$ Ω·cm or less. The target material must have a conductivity of $10^{-2}$ Ω·cm or less.

As a sintered silicon carbide used as the target material, it is preferable to use a sintered silicon carbide having high density, high purity and a volume resistivity of $10^0$Ω·cm or less. The sintered silicon carbide is obtained by carrying out a step of charging a nitrogen-containing compound at the time of preparing a mixture of silicon carbide powder and a non-metallic sintering aid or carrying out a step of charging a nitrogen-containing compound at the time of mixing carbon material and silicon material which are materials for silicon carbide power at the time of preparing thereof, in a process of manufacturing a sintered silicon carbide disclosed in JP-A No. 10-67565 which has already been proposed by the present inventors. Further, it is more preferable to use a sintered silicon carbide having high density, high purity, an impurity ratio of less than $1.0 \times 10^{11}$ atoms/cm$^2$ on or in a vicinity of the surface thereof by carrying out a washing method disclosed in specifications of Japanese Patent Application Nos. 10-348570 and 10-348700 which have already been proposed by the present inventors, and a volume resistivity of $10^0$ Ω·cm or less.

A description will be given of a method of carrying out sputtering with a sintered silicon carbide used as the target material.

The sputtering may be effected under an inert gas (such as argon) atmosphere. An atmospheric pressure after the inert gas is introduced is $1.0 \times 10^{-1}$ to $1.0 \times 10^0$ Pa.

The optical characteristics including a light transmittance and a light reflectance of a silicon carbide coating layer of a laminated structure of the present invention manufactured by a manufacturing method of a laminated structure of the present invention can be controlled by electric power inputted at the time of sputtering, flow rate of oxygen gas or nitrogen gas introduced (the flow amount of gas introduced may be zero (i.e., no gas is introduced)) and sputtering time (i.e., a thickness of the silicon carbide coating layer).

The electric power to be inputted at the time of sputtering may e different depending on an area of the target material. The density electric power inputted to the target material is computed by (electric power to be inputted/area of target material). A density of inputted electric power which is too large may cause damage of the target material. Thus, the density of inputted electric power is preferably 1.25 to 15.0 W/cm$^2$.

An example of the present invention will be described hereinafter, but the present invention is not limited to the example.

Preparation of Target Material

The target material was a sintered silicon carbide obtained by a method described in Example 1 in the specification of Japanese Patent Application No. 10-348700. The sintered silicon carbide had a density of 3.13 g/cm$^3$, an impurity ratio of less than $1.0 \times 10^{11}$ atoms/cm$^2$ on or in a vicinity of the surface thereof, and a volume resistivity of $3.2 \times 10^{-2}$ Ω·cm.

Sputtering Method

A target material was formed so as to have a size of φ 100 mm×5 mm (thickness). The target material was disposed in a sputtering device (SH-250 manufactured by ULVAC JAPAN, Ltd.). An ultimate vacuum within the sputtering device was adjusted to $7 \times 10^{-5}$ Pa. Then, argon gas was supplied to the sputtering device at a flow rate of 10 cm$^3$/min. The time for forming a silicon carbide coating layer was adjusted to obtain a thickness of the silicon carbide coating layer represented in Table 1. As a result, a laminated structure having a silicon carbide coating layer on an alloy substrate having a size of 5 cm×5 cm×1 cm (thickness) which substrate was washed by a washing solution (TMSC manufactured by TAMA CHEMICALS CO., LTD.) was prepared.

It was measured and confirmed that the thickness of the formed silicon carbide coating layer had a desired thickness using a stylus instrument of thickness mesurement (Talystep manufactured by Rank Tayer Hobson).

Evaluating Method

Oxidation Resistance: the resultant laminated structure was kept under an oxygen atmosphere at 50° C. for 1,000 hours. Then, weight changes of the silicon carbide coating layer was measured. Chlorine Resistance: the resultant laminated structure was kept under a chlorine atmosphere at 50° C. for 1,000 hours. Then, weight changes of the silicon carbide coating layer was measured. Humidity Resistance: a silicon carbide coating layer was formed on an iron substrate and then kept under an atmosphere of 50° C. and 70% humidity for 1,000 hours. Then, changes of the iron substrate was observed by an optical microscope at a magnification of X 1,000.

The silicon carbide coating layer was formed on a glass substrate by sputtering, while electric power inputted to a sputtering device, flow rate of oxygen gas and/or nitrogen gas introduced and sputtering time were changed as shown in Table 1. An atmosphere which was reached before inactive gas was introduced was $7 \times 10^{-5}$ Pa. Results are shown in Table 1.

TABLE 1

| Electric Power (W) | Flow Rate of N$_2$ (cm$^3$/min) | Thickness of Coating Layer (nm) | | | | | Weight Changes in Oxidation Resistance Test (%) | Weight Changes in Chlorine Resistance Test (%) | Humidity Resistance Test |
|---|---|---|---|---|---|---|---|---|---|
| | | 15 | 40 | 60 | 75 | 100 | | | |
| 1000 | 0.0 | 62.5 | 30.0 | 32.5 | 49.5 | 72.8 | 0 | 0 | No Changes |
| 500 | 0.0 | 62.5 | 30.0 | 32.4 | 49.1 | 71.9 | 0 | 0 | No Changes |
| 100 | 0.0 | 63.2 | 30.5 | 32.5 | 48.4 | 73.0 | 0 | 0 | No Changes |
| 500 | 0.5 | 73.6 | 38.9 | 36.1 | 44.9 | 81.3 | 0 | 0 | No Changes |
| 500 | 1.0 | 79.3 | 45.3 | 39.8 | 45.1 | 74.5 | 0 | 0 | No Changes |
| 500 | 1.5 | 83.2 | 50.7 | 43.4 | 46.5 | 69.2 | 0 | 0 | No Changes |
| 500 | 2.0 | 85.0 | 53.8 | 45.5 | 47.5 | 66.7 | 0 | 0 | No Changes |
| 1000 | 1.0 | 74.5 | 39.8 | 36.6 | 45.0 | 81.3 | 0 | 0 | No Changes |
| 100 | 1.0 | 85.8 | 55.4 | 46.7 | 48.0 | 65.0 | 0 | 0 | No Changes |
| 1000 | 2.0 | 80.7 | 47.1 | 40.9 | 45.4 | 72.4 | 0 | 0 | No Changes |
| 100 | 2.0 | 88.7 | 61.4 | 51.5 | 51.1 | 62.6 | 0 | 0 | No Changes |

Light Transmittance (%) (Wavelength of Incident Light: 633 nm)

The data for light transmittance of silicon carbide coating layers of manufactured laminated structures is shown in Table 1. In Table 1, numerical values representing a light transmittance of less than 70% shown in a column titled Thickness of Coating Layer are for Comparative Examples and numerical values of 70% or greater are for Examples.

INDUSTRIAL APPLICABILITY

Problems of the prior art are solved by the present invention. By having a silicon carbide coating layer which is excellent in oxidation resistance, chlorine resistance, humidity resistance, and which has high refractive index and high light transmittance, the present invention can provide a laminated structure which is suitable for an optical disk recording medium such as a CD-RW, a DVD-RAM or the like and a method of manufacturing a laminated structure which can manufacture the laminated structure simply and reliably.

What is claimed is:

1. A laminated structure which has a silicon carbide coating layer formed on an alloy substrate by sputtering in which a sintered silicon carbide having a volume resistivity of $10^0$ Ω·cm or less is used as a target material, wherein the silicon carbide coating layer has a light transmittance of 70% or greater.

2. The laminated structure according to claim 1, wherein the impurity ratio on the surface of the silicon carbide coating layer is less than $1.0 \times 10^{12}$ atoms/cm$^2$.

3. The laminated structure according to claim 1, wherein the thickness of the silicon carbide coating layer is 10 to 100 nm.

4. A manufacturing method of a laminates structure having a silicon carbide coating layer formed on an alloy substrate by sputtering in which a sintered silicon carbide having a volume resistivity of $10^0$ Ω·cm or less is used as a target material, wherein the silicon carbide coating layer is formed by controlling electric power inputted to a puttering device, flow rate of oxygen gas or nitrogen gas introduced and sputtering time.

5. The manufacturing method of a laminated structure according to claim 4, the target material is a sintered silicon carbide, and the sintered silicon carbide has an impurity ratio of $1.0 \times 10^{11}$ atoms/cm$^2$ or less on and in a vicinity of the surface thereof, and a density of 2.9 g/cm$^3$ or greater.

6. The laminated structure according to claim 1, wherein the density of the silicon carbide coating layer is 2.9 g/cm$^3$ or greater.

7. The laminated structure according to claim 1, used as an optical disk recording medium.

8. A laminated structure that has a silicon carbide coating layer formed on an alloy substrate by sputtering in which a sintered silicon carbide having a volume resistivity of $10^0$ Ω·cm or less is used as a target material, wherein the silicon carbide coating layer has a light transmittance of 70% or greater, and undergoes substantially no weight change when kept under a chlorine atmosphere.

9. The method according to claim 4, wherein the sintered silicon carbide has a volume resistivity of $10^{-2}$ Ω·cm or less.

10. The laminated structure according to claim 1, wherein the alloy substrate is formed of a magnetic alloy or a phase-changing alloy.

11. The laminated structure according to claim 1, wherein the silicon carbide coating layer undergoes substantially no weight change when kept under an oxygen atmosphere, and wherein the alloy substrate is a phase-changing alloy.

12. The method of claim 4, wherein the alloy substrate is a phase-changing alloy.

13. The laminated structure of claim 8, wherein the alloy substrate is a phase-changing alloy.

* * * * *